(12) United States Patent
Nan et al.

(10) Patent No.: US 11,362,157 B2
(45) Date of Patent: Jun. 14, 2022

(54) DISPLAY PANEL, DISPLAY DEVICE AND MANUFACTURING METHOD OF THE DISPLAY PANEL

(71) Applicants: Chengdu BOE Optoelectronics Technology Co., Ltd., Chengdu (CN); BOE TECHNOLOGY GROUP CO., LTD., Beijing (CN)

(72) Inventors: Xianghua Nan, Beijing (CN); Qingyun Bai, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 136 days.

(21) Appl. No.: 16/642,644

(22) PCT Filed: Jul. 17, 2019

(86) PCT No.: PCT/CN2019/096411
§ 371 (c)(1),
(2) Date: Feb. 27, 2020

(87) PCT Pub. No.: WO2020/042806
PCT Pub. Date: Mar. 5, 2020

(65) Prior Publication Data
US 2021/0151528 A1     May 20, 2021

(30) Foreign Application Priority Data
Aug. 27, 2018    (CN) .......................... 201810982535.1

(51) Int. Cl.
*H01L 27/32*     (2006.01)
*H01L 51/56*     (2006.01)

(52) U.S. Cl.
CPC ...... *H01L 27/3246* (2013.01); *H01L 27/3283* (2013.01); *H01L 51/56* (2013.01); *H01L 27/3211* (2013.01)

(58) Field of Classification Search
None
See application file for complete search history.

(56) References Cited

U.S. PATENT DOCUMENTS

| 9,331,127 B2 | 5/2016 | Kim et al. |
| 9,978,818 B2 | 5/2018 | Xiong et al. |

(Continued)

FOREIGN PATENT DOCUMENTS

| CN | 104659070 | 5/2015 |
| CN | 105489631 | 4/2016 |

(Continued)

OTHER PUBLICATIONS

International Search Report and Written Opinion dated Oct. 15, 2019 for PCT Patent Application No. PCT/CN2019/096411.

(Continued)

*Primary Examiner* — Michelle Mandala
(74) *Attorney, Agent, or Firm* — Thomas | Horstemeyer LLP

(57) ABSTRACT

The present disclosure provides a display panel, a display device including the display panel, and a method of manufacturing the display panel. The display panel includes a substrate; a pixel-defining layer disposed on the substrate, wherein the pixel-defining layer defines a plurality of sub-pixel regions arranged in rows and columns; and an organic light emitting element disposed in at least one of the plurality of sub-pixel regions, wherein a side of the pixel-defining layer away from the substrate is provided with a groove, the groove has a depth less than a thickness of the pixel-defining layer, and the groove is disposed between the (Continued)

organic light emitting elements that are adjacent to each other and emit light of different colors.

8 Claims, 6 Drawing Sheets

(56) References Cited

U.S. PATENT DOCUMENTS

| | | | |
|---|---|---|---|
| 10,205,117 B2 * | 2/2019 | Song | H01L 27/3248 |
| 2014/0361260 A1 | 12/2014 | Kim et al. | |
| 2015/0001485 A1 * | 1/2015 | Kang | H01L 51/0005 |
| | | | 257/40 |
| 2016/0268354 A1 | 9/2016 | Xiong et al. | |
| 2016/0284774 A1 * | 9/2016 | Zhang | H01L 27/1218 |
| 2017/0047385 A1 * | 2/2017 | Teng | H01L 27/3246 |
| 2018/0350886 A1 * | 12/2018 | An | H01L 27/3248 |
| 2018/0366524 A1 * | 12/2018 | Bang | H01L 51/0011 |
| 2019/0288044 A1 * | 9/2019 | Hou | H01L 27/32 |

FOREIGN PATENT DOCUMENTS

| | | |
|---|---|---|
| CN | 107068721 | 8/2017 |
| CN | 206774550 | 12/2017 |
| CN | 109148538 | 1/2019 |

OTHER PUBLICATIONS

1st Office Action dated Jan. 16, 2020 for Chinese Patent Application No. 201810982535.1.
2nd Office Action dated Jul. 29, 2020 for Chinese Patent Application No. 201810982535.1.

* cited by examiner

DISPLAY PANEL, DISPLAY DEVICE AND MANUFACTURING METHOD OF THE DISPLAY PANEL

CROSS-REFERENCE TO RELATED APPLICATION

The present application is based upon International Application No. PCT/CN2019/096411, filed on Jul. 17, 2019, which is based upon and claims the benefit of and priority to Chinese Patent Application No. 201810982535.1 filed on Aug. 27, 2018, entitled "DISPLAY PANEL, DISPLAY DEVICE AND MANUFACTURING METHOD OF THE DISPLAY PANEL", which is incorporated herein by reference in its entirety.

TECHNICAL FIELD

The present disclosure generally relates to the field of display technology and, more particularly, to a display panel, a display device including the display panel, and a manufacturing method of the display panel.

BACKGROUND

Organic light-emitting display devices are considered the next generation of display devices due to various advantages, such as wide viewing angle, good contrast, and quick response.

When manufacturing an organic light emitting display device, respective layers of an organic light emitting element are generally formed by an evaporation process. However, since a high-precision mask used in the evaporation process may have an alignment error, adjacent organic light-emitting elements (for example, the respective layers thereof) emitting different colors may attach to or overlap each other, resulting in display degradation.

It should be noted that the information disclosed in the background section above is only used to enhance the understanding of the background of the present disclosure, and therefore, may include information that does not constitute the prior art known to those of ordinary skill in the art.

SUMMARY

The present disclosure provides a display panel, a display device including the display panel, and a manufacturing method of the display panel.

According to an aspect of the present disclosure, there is provided a display panel, including: a substrate; a pixel-defining layer disposed on the substrate, wherein the pixel-defining layer defines a plurality of sub-pixel regions arranged in rows and columns; and an organic light emitting element disposed in at least one of the plurality of sub-pixel regions, wherein a side of the pixel-defining layer away from the substrate is provided with a groove, the groove has a depth less than a thickness of the pixel-defining layer, and the groove is disposed between the organic light emitting elements that are adjacent to each and emit light of different colors.

In some embodiments of the present disclosure, the groove is disposed between the organic light emitting element emitting red light and the organic light emitting element emitting green light which are adjacent to each other.

In some embodiments of the present disclosure, the depth of the groove is larger than an entire thickness of the organic light emitting element.

In some embodiments of the present disclosure, an angle formed by a sidewall of the groove and a bottom surface of the groove is not less than 142 degrees.

In some embodiments of the present disclosure, the pixel-defining layer includes a first sub-layer and a second sub-layer, the first sub-layer has a first via hole passing through the first sub-layer, and the second sub-layer are disposed at least in the first via hole to define the groove.

In some embodiments of the present disclosure, the second sub-layer covers at least a part of a surface of the first sub-layer away from the substrate.

In some embodiments of the present disclosure, a material of the first sub-layer is different from the material of the second sub-layer.

According to another aspect of the present disclosure, there is provided a display device, including any one of the display panels.

According to yet another aspect of the present disclosure, there is provided a method of manufacturing a display panel, comprising: forming a pixel-defining layer on a substrate, wherein the pixel-defining layer defines a plurality of sub-pixel regions arranged in rows and columns; and forming an organic light emitting element in at least one of the plurality of sub-pixel regions, wherein a side of the pixel-defining layer away from the substrate is formed to have a groove, the groove has a depth less than a thickness of the pixel-defining layer and, the groove is disposed between the organic light emitting elements that are adjacent to each other and emit light of different colors.

In some embodiments of the present disclosure, the step of forming a pixel-defining layer on a substrate includes: depositing a first pixel-defining material on the substrate; patterning the first pixel-defining material to form a plurality of first openings exposing the plurality of sub-pixel regions respectively and a plurality of first via holes between at least two adjacent first openings; and depositing and patterning a second pixel-defining material on the first pixel-defining material and the plurality of first via holes, to form the plurality of grooves at positions corresponding to the plurality of first via holes.

In some embodiments of the present disclosure, the first via hole passes through the first pixel-defining material.

In some embodiments of the present disclosure, the step of forming a pixel-defining layer on a substrate includes depositing a pixel-defining material on the substrate; patterning the pixel-defining material to form a plurality of first openings exposing the plurality of sub-pixel regions respectively; and patterning the pixel-defining material to form the plurality of grooves.

In some embodiments of the present disclosure, the step of forming a pixel-defining layer on a substrate includes: depositing a first pixel-defining material on the substrate; patterning the first pixel-defining material to form a plurality of first openings exposing the plurality of sub-pixel regions respectively and a plurality of first via holes passing through the first pixel-defining material between the first openings adjacent to each other; and depositing a second pixel-defining material in the plurality of first via holes to form the plurality of grooves.

BRIEF DESCRIPTION OF THE DRAWINGS

The accompanying drawings are included to provide a further understanding of the present disclosure, and are incorporated in and constitute a part of this application. The drawings illustrate embodiments of the present disclosure and, together with the description, serve to explain the principles of the present disclosure. In the drawings.

DETAILED DESCRIPTION

Exemplary embodiments of the present disclosure will now be described more fully with reference to the accompanying drawings. However, the embodiments can be implemented in various forms and should not be construed as limited to the examples set forth herein. Rather, these embodiments are provided so that this disclosure will be more comprehensive and complete, and will fully convey the concepts of the disclosure to those skilled in the art. The described features, structures, or characteristics may be combined in any suitable manner in one or more embodiments.

For ease of description, spatially relative terms such as 'below', 'above', 'on', 'under', etc. may be used herein to describe the relationship between one element or feature with other elements or features as shown in the figures. It will be understood that spatially relative terms are intended to encompass different orientations of the device in use or operation in addition to the orientations described in the figures.

It will also be understood that when the terms 'comprising' and/or 'including' are used in this specification, the presence of stated features, integers, steps, operations, elements, and/or components is stated, but that not exclude the existence or addition of one or more other features, integers, steps, operations, elements, components, and/or groups thereof.

Figure 1:
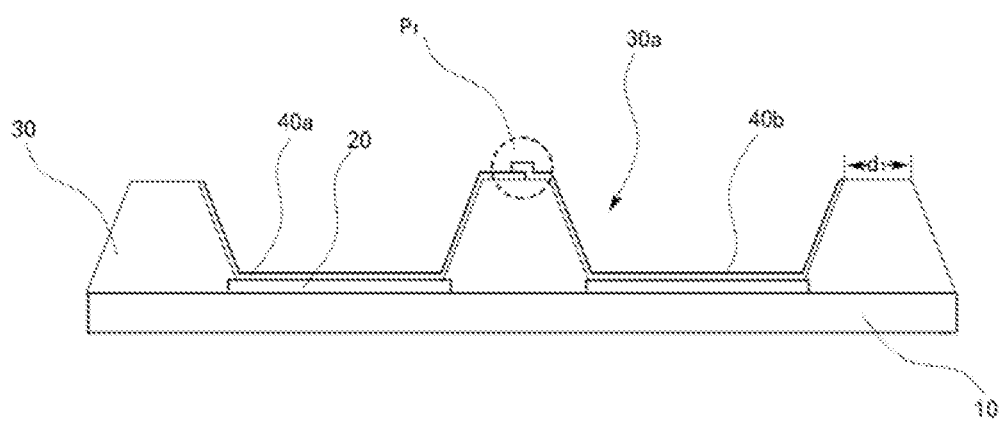
FIG. 1 is a schematic view schematically showing a display panel.

FIG. 1 is a schematic view schematically showing a display panel.

As shown in FIG. 1, the display panel includes a substrate 10, a plurality of first electrodes 20 formed on the substrate 10, a pixel-defining layer 30 having a plurality of first openings 30a that expose at least a portion (for example, a central portion) of the plurality of first electrodes 20, and a plurality of organic light emitting elements formed on the plurality of first electrodes 20 in the plurality of first openings 30a, wherein the plurality of organic light emitting elements at least include a first organic light emitting element 40a and a second organic light emitting element 40b.

During the manufacturing process, respective layers of the organic light emitting elements 40a and 40b, such as a hole injection layer, a hole transport layer, an electron blocking layer, an emission layer, a hole blocking layer, an electron transport layer, and electron injection layer, are generally formed by an evaporation process.

However, due to an alignment error of a high-precision mask used in the evaporation process, the adjacent first organic light-emitting elements 40a and second organic light-emitting elements 40b (for example, the respective layers thereof) emitting light of different colors may attach to or overlap on each other, as shown in region P1 in FIG. 1. For example, when an alignment accuracy of the mask is in the range of 8-10 μm, and the distance between the two adjacent first openings of the pixel-defining layer 30 (i.e., the distance d1 shown in FIG. 1) is 19 μm, the organic light emitting elements 40a and 40b may have an attaching area or an overlapping area with a width of about 1 μm in the worst case, that is, when the masks used in forming two adjacent organic light emitting elements 40a and 40b are both at the worst alignment accuracy.

Such attaching or overlapping may cause display degradation of the display panel. For example, when the first organic light-emitting element 40a is an organic light-emitting element that emits red light, and the second light-emitting element 40b is an organic light-emitting element that emits green light, since the energy band gap of the light-emitting material of the first organic light-emitting element 40a is relatively narrow, parts of the holes transported in the second organic light emitting element 40b (for example, the electron blocking layer thereof) will be transported into the emission layer of the first organic light emitting element 40a via the attaching area or the overlapping area, and will be combined with electrons in the emission layer of the first organic light emitting element 40a to emit red light, thereby generating extra red light at the edge of the pixel that emits red light. Especially in the case where the display panel displays a white screen, the extra infrared generated as described above may cause the white screen to appear red, and the display of the display panel may be degraded.

Figure 2:
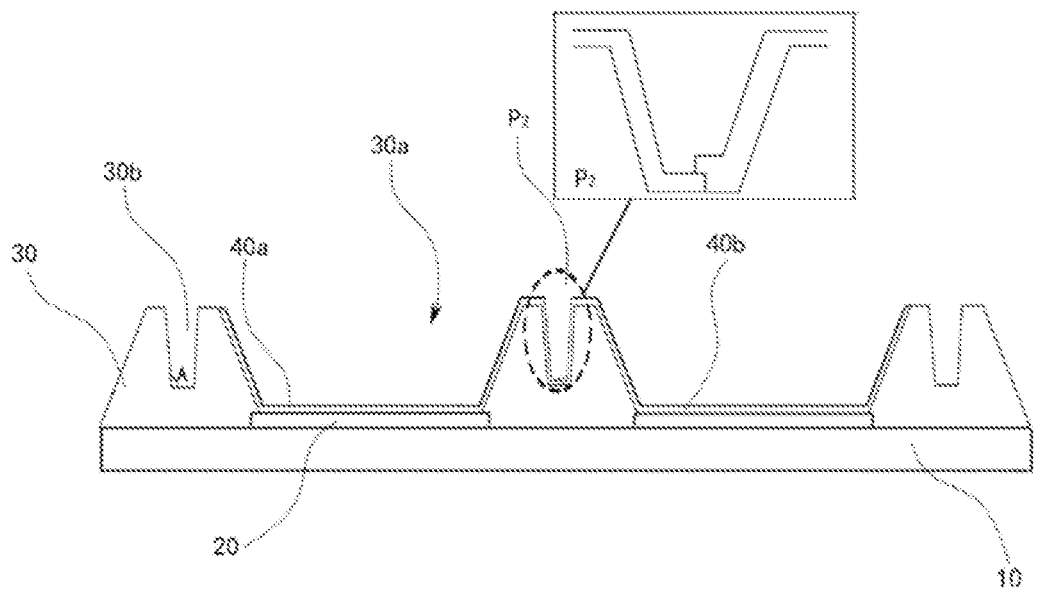
FIG. 2 is a schematic view schematically showing a display panel according to an embodiment of the present disclosure.

FIG. 2 is a schematic view schematically showing a display panel according to an embodiment of the present disclosure.

As shown in FIG. 2, the display panel may include a substrate 10, a plurality of first electrodes 20, a pixel-defining layer 30, and organic light emitting elements 40a and 40b. The plurality of first electrodes 20 are formed on the substrate 10. The pixel-defining layer 30 has a plurality of first openings 30a exposing at least a part of the plurality of first electrodes 20. The organic light emitting elements 40a and 40b are formed on the exposed portion of the first electrodes 20, and include a first organic light emitting element 40a and a second organic light emitting element 40b that are adjacent to each other and emit light of different colors. The pixel-defining layer 30 also has a groove 30b. The groove 30b has a depth smaller than a thickness of the pixel-defining layer 30. For example, the groove 30b may be formed without exposing the substrate 10. In addition, the groove 30b is disposed between the first organic light emitting element 40a and the second organic light emitting element 40b, which are adjacent to each other and emit light of different colors.

Although not shown, the pixel-defining layer 30 may define a plurality of sub-pixel regions on the substrate 10 which are arranged in rows and columns and in which the organic light-emitting elements are disposed.

Figure 3:
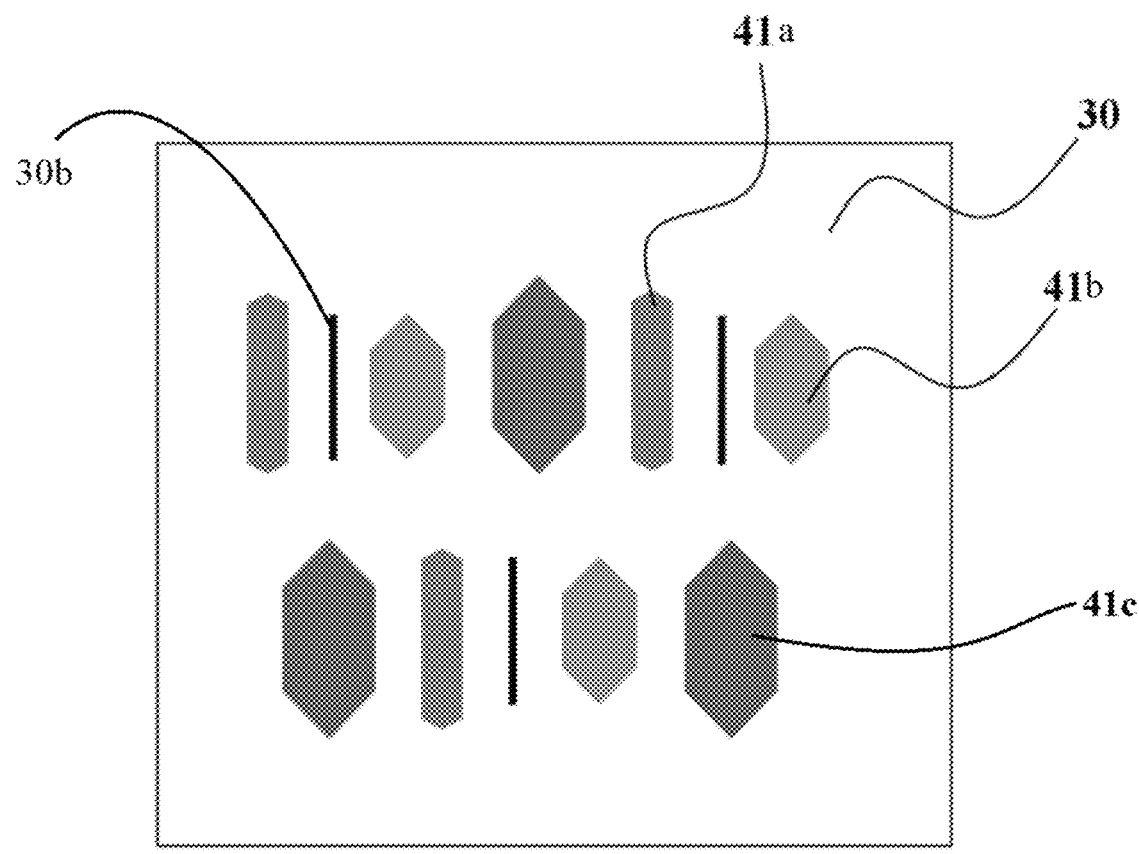
FIG. 3 is a plan view schematically showing a display panel according to an embodiment of the present disclosure.

FIG. 3 is a schematic plan view specifically showing arrangement positions of the grooves 30b in the organic light emitting element matrix according to an embodiment of the present disclosure.

As shown in FIG. 3, the pixel-defining layer 30 defines a plurality of sub-pixel regions on the substrate, which are arranged in rows and columns and in which organic light-emitting elements 41a-41c are disposed. The organic light emitting elements 41a-41c include a first organic light emitting element 41a, a second organic light emitting element 41b, and a third organic light emitting element 41c that emit light of different colors. For example, the first organic light emitting element 41a, the second organic light emitting element 41b, and the third organic light emitting element 41c may be an organic light emitting element that emits red light, an organic light emitting element that emits green light, and an organic light emitting element that emits blue, respectively.

The groove 30b is disposed in the pixel-defining layer 30 and is disposed between the first organic light emitting element 41a that emits red light and the second organic light emitting element 41b that emits green light. Here, a length of the groove 30b may be equal to the shorter length of the lengths of the first and second organic light emitting elements 41a and 41b. However, the present disclosure is not limited thereto. The length of the groove 30b may be longer than the length of the second organic light emitting element 41b which is shorter, as long as the first organic light emitting element 41a and the second organic light emitting element 41b can be prevented from be overlapped with each other, as described later.

In the display panel according to the present embodiment, the groove 30b is formed between the adjacent organic light emitting elements 40a and 40b that emit light of different colors in the pixel-defining layer 30, thus display degradation caused by the attaching or overlapping (shown as in region P2 in FIG. 2) of the adjacent organic light emitting elements 40a and 40b that emit light of different colors can be prevented.

Specifically, when organic materials are evaporated to form the organic light-emitting elements 40a and 40b, the organic material deposited in the groove 30b has poor uniformity because the material is not deposited in a direction completely perpendicular to the substrate 10, but is diffused to a certain extent. Compared with the case where the groove is not formed as shown in FIG. 1, the groove 30b in this embodiment can make the deposition distance of the organic materials of the organic light emitting elements 40a and 40b be longer, and further make respective thin film layers of the organic light emitting elements 40a and 40b be thinner or even broken in the groove 30b. There are multiple corners in the groove 30b, and these corners can make the respective film layers of the organic light emitting elements 40a and 40b be bent and further broken.

Therefore, in the groove 30b, at least one film layer of the organic light emitting element 40a and/or 40b cannot be stably formed or may be broken, so that the above-mentioned display degradation can be effectively prevented.

The substrate 10 may be formed of a light-transmitting material such as glass or plastic. Although not shown, as will be recognized by those skilled in the art, a thin film transistor, a capacitor, a wiring, and the like may be arranged on the substrate 10 to drive the organic light emitting elements 40a and 40b to emit light.

The first electrode 20 may be a pixel electrode, which may include a transparent electrode formed of a transparent conductive material or a reflective electrode formed of a reflective conductive material. The transparent conductive material may include ITO, IZO, and the like, and the reflective conductive material may include Ag, Mg, Al, and the like, for example.

The pixel-defining layer 30 is formed on the substrate 10 and the plurality of first electrodes 20, and may be formed of an organic insulating material such as an acrylic polymer. A plurality of first openings 30a are formed in the pixel-defining layer 30 to expose at least a portion of the plurality of first electrodes 20, for example, to expose at least a central portion of the plurality of first electrodes 20.

In addition, the groove 30b is formed in the pixel-defining layer 30. Specifically, the groove 30b is formed between organic light emitting elements 40a and 40b that are adjacent to each other and emit light of different colors, and has a depth smaller than a thickness of the pixel-defining layer 30 as described above. In other words, a vertical distance from the top of the pixel-defining layer 30 to the bottom of the groove 30b is smaller than the thickness of the pixel-defining layer 30 such that the pixel-defining layer 30 cannot be penetrated by the groove 30b.

The groove 30b may have a plurality of corners, for example, a corner formed by the top of the pixel-defining layer 30 and the wall of the groove 30b, so that the light emitting material formed in the groove 30b is bent by the corner, thereby preventing the above mentioned display degradation.p In some embodiments of the present disclosure, the groove 30b may have a flat bottom surface, as shown in FIG. 2. Therefore, a corner may be formed at the bottom of the groove 30b, so that the light emitting material formed in the groove 30b is bent by the corner at the bottom of the groove 30b, thereby preventing the above mentioned display degradation. According to an exemplary embodiment of the present disclosure, an angle formed between a bottom surface of the groove 30b and a sidewall of the groove 30b (as shown by A in FIG. 2) may be not less than 142 degrees, and preferably 150 to 155 degrees, in order to prevent the organic light emitting elements emitting light of different colors from being overlapped with each other.

In some embodiments of the present disclosure, the depth of the groove 30b may be greater than the thickness of the organic light emitting elements 40a and 40b. In this case, the thicknesses of the respective film layers of the organic light emitting elements 40a and 40b formed in the groove 30b may be thinner and the uniformity thereof may be worse.

In addition, as shown in FIG. 2, the wall of the groove 30b may be inclined with respect to the bottom of the groove 30b. Therefore, the area of the bottom of the groove 30b may be smaller than the area of the upper opening of the groove 30b.

In some embodiments of the present disclosure, the groove 30b may be disposed between the organic light emitting element emitting red light and the organic light emitting element emitting green light, which are adjacent to each other, thereby preventing the occurrence of such display defects: in the case where the organic light emitting element emitting red light and the organic light emitting element emitting green light are attached or overlapped, since the energy band gap of the light emitting material of the organic light emitting element emitting red light is relatively narrow, parts of holes transported in the organic light emitting element emitting green light (for example, the electron blocking layer thereof) will be transported into the organic light emitting element emitting red light via the attaching area or the overlapping area, and will be combined with electrons in the emission layer of the organic light emitting element emitting red light to emit red light. However, the present disclosure is not limited thereto, and the grooves 30b may be disposed between the adjacent organic light emitting elements that emit light of any different colors to prevent the display degradation caused by the attaching or overlapping of the organic light emitting elements that emit light of different colors.

The organic light emitting elements 40a and 40b that emit light of different colors may be formed in the plurality of first openings 30a, respectively. The organic light emitting elements 40a and 40b may be organic light emitting diodes (OLED), respectively. The organic light emitting elements 40a and 40b each include an emission layer, and may further include at least one of a hole injection layer, a hole transport layer, an electron blocking layer, a hole blocking layer, an electron transport layer, and an electron injection layer.

In addition, although not shown, the display panel according to an embodiment of the present disclosure may further include a second electrode as an opposite electrode. The second electrode may be disposed on the organic light emitting elements 40a and 40b. In addition, the second electrode may be further formed on the pixel-defining layer 30 to correspond to the entire display panel, thereby serving as a common electrode.

An exemplary embodiment of the present disclosure also provides a display device including any of the above display panels, for example, an OLED display device.

A method of manufacturing the above-described display panel according to an exemplary embodiment of the present disclosure will now be described in detail with reference to the accompanying drawings.

As shown in FIG. 2, a plurality of first electrodes 20 may be firstly formed on a substrate 10. In some embodiments of the present disclosure, an electrode material of the first electrode 20 may be deposited on the substrate 10, and the plurality of first electrodes 20 may be formed by patterning the deposited electrode material.

Then, a pixel-defining layer 30 is formed on the substrate 10. Here, the pixel-defining layer 30 is formed to have a plurality of first openings 30a exposing at least a part of the plurality of first electrodes 20, and is also formed to have a groove 30b, the groove 30b has a depth smaller than a thickness of the pixel-defining layer 30 and is disposed between the adjacent first openings 30a in which organic light emitting elements that emit light of different colors will be formed. The steps of forming the pixel-defining layer 30 on the substrate 10 will be described in detail below with reference to FIGS. 3a to 5d.

Next, organic light emitting elements 40a and 40b are formed on the exposed portions of the first electrodes 20. Specifically, first organic light emitting elements 40a emitting light of a first color may be formed in a first part of the plurality of first openings 30a by the evaporation process, and second organic light emitting elements 40b emitting light of a second color may be formed in a second part of the plurality of first openings 30a by the evaporation process.

According to an exemplary embodiment of the present disclosure, a second electrode may also be formed on the organic light emitting elements 40a and 40b. The second electrode may be further formed on the pixel-defining layer 30 as a common electrode corresponding to the entire display panel.

Next, the steps of forming a pixel-defining layer on a substrate according to an exemplary embodiment of the present disclosure will be described in detail with reference to the accompanying drawings.

FIGS. 4a-4d are schematic views schematically illustrating forming a pixel-defining layer on a substrate according to an embodiment of the present disclosure.

Figure 4A:
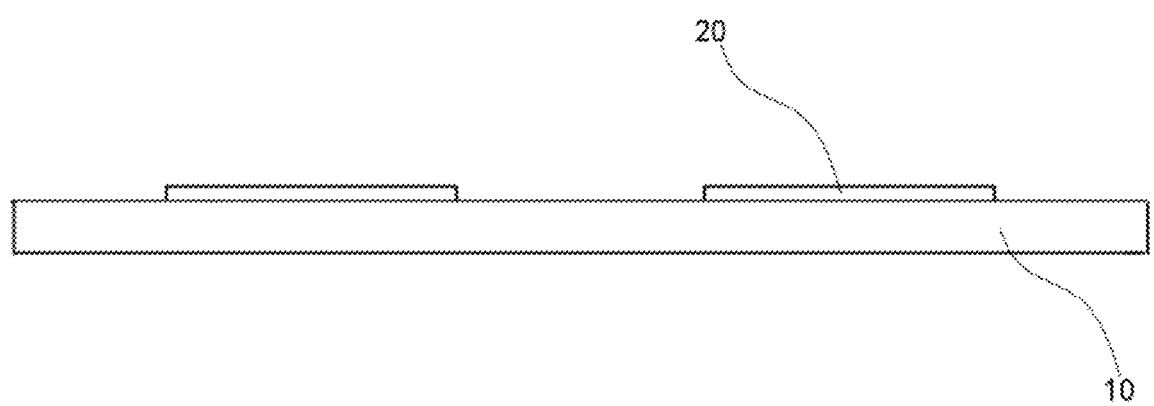
FIGS. 4a-4d are schematic views schematically illustrating forming a pixel-defining layer on a substrate according to an embodiment of the present disclosure.
Figure 4B:
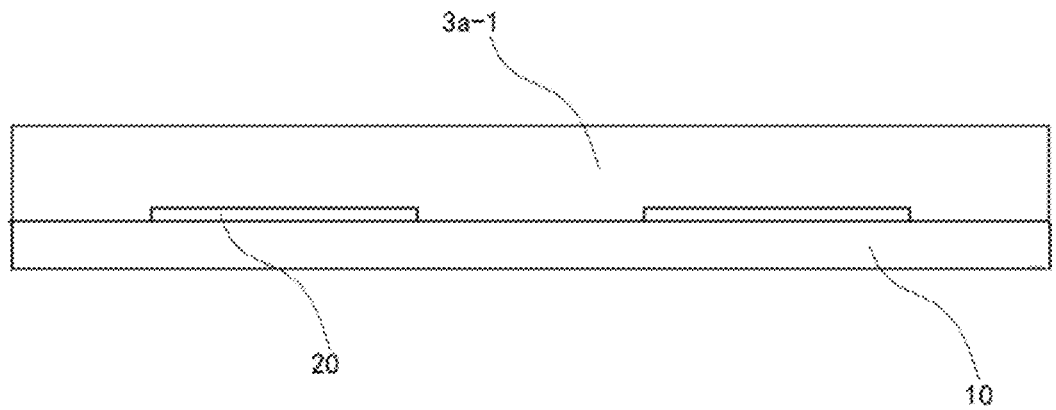

As shown in FIGS. 4a and 4b, a first pixel-defining material 30-1 is deposited on the substrate 10 to cover the substrate 10 and the plurality of first electrodes 20.

Figure 4C:
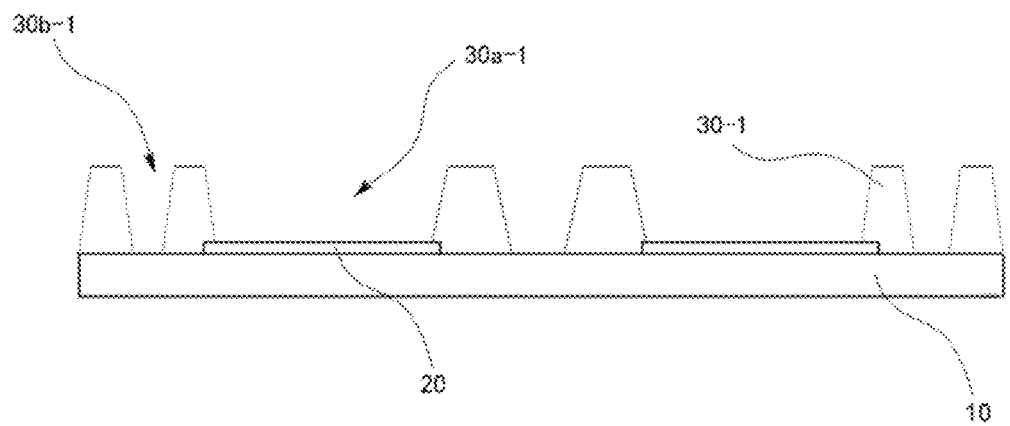

As shown in FIG. 4c, the first pixel-defining material 30-1 is etched to form a plurality of first openings 30a-1 exposing at least a part of the plurality of first electrodes 20 and a plurality of first via holes 30b-1 between the adjacent first openings 30a-1. The first opening 30a-1 is etched to expose at least a portion of the first electrode 30, for example, at least a central portion thereof. The first via hole 30b-1 is etched to expose a part of the substrate 10, however, the present disclosure is not limited thereto, and for example, the first via hole 30b-1 may be etched to expose the substrate 10. Furthermore, according to an exemplary embodiment of the present disclosure, the first opening 30a-1 and the first via hole 30b-1 having different depths may be formed by different etching steps, however, the present disclosure is not limited thereto, and for example, the first opening 30a-1 and the first via hole 30b-1 may be etched to have the same depth by the same etching steps.

Figure 4D:
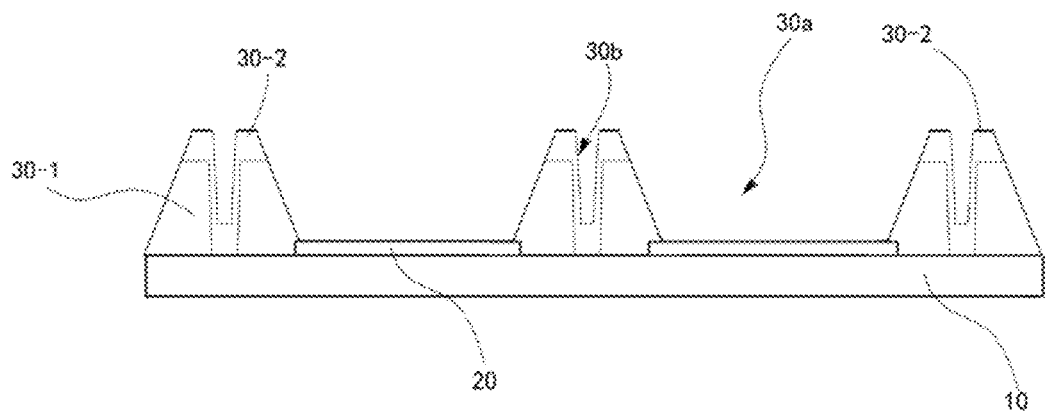

As shown in FIG. 4d, a second pixel-defining material 30-2 is deposited on the first pixel-defining material 30-1 and the plurality of first via holes 30b-1, and thus the plurality of first openings 30a are formed at the positions of the plurality of first openings 30a-1, and the plurality of grooves 30b are formed at the positions of the plurality of first via holes 30b-1.

Here, a mask may be used to deposit the second pixel-defining material 30-2 on the first pixel-defining material 30-1 and the plurality of first via holes 30b-1 to prevent the second pixel-defining material 30-2 from being deposited in the first opening 30a-1. According to an exemplary embodiment of the present disclosure, the first pixel-defining material 30-1 and the second pixel-defining material 30-2 may be different, but the present disclosure is not limited thereto, and the first pixel-defining material 30-1 and the second pixel-defining material 30-2 can be the same.

The via hole herein refers to passing through the first pixel material, and the shape of the via hole is not limited. The shape of the via hole along a cross section parallel to the substrate may be a square, a circle, a polygon, or the like.

FIGS. 5a to 5d are schematic views schematically illustrating forming a pixel-defining layer on a substrate according to another embodiment of the present disclosure.

Figure 5A:
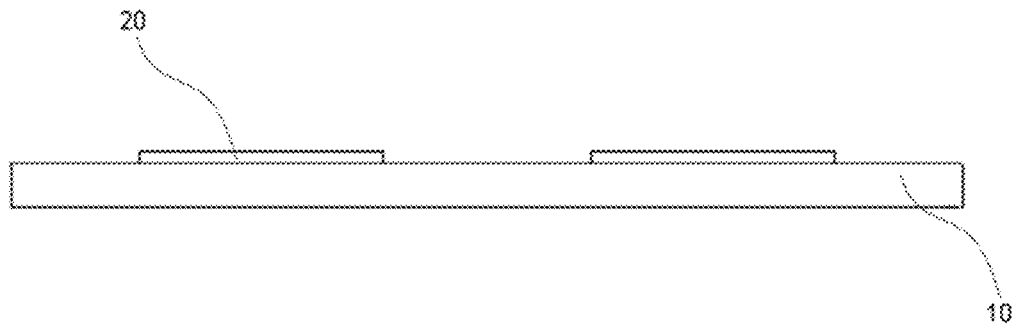
FIGS. 5a-5d are schematic views schematically illustrating forming a pixel-defining layer on a substrate according to another embodiment of the present disclosure.
Figure 5B:
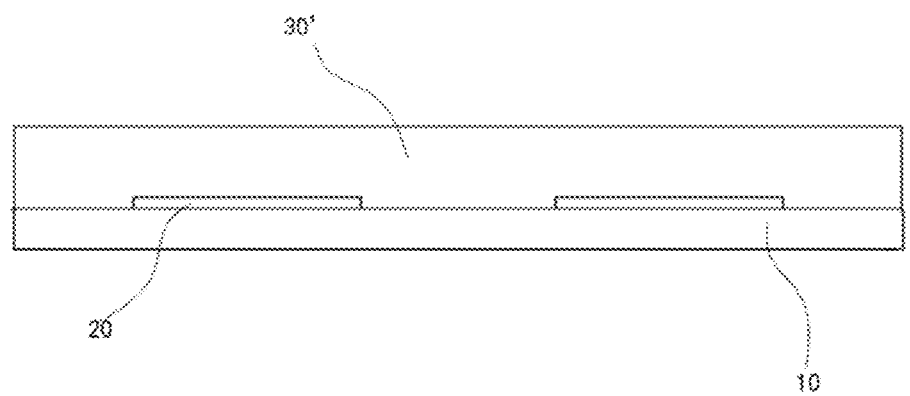

As shown in FIGS. 5a and 5b, a pixel-defining material 30' is deposited on the substrate 10 to cover the substrate 10 and the plurality of first electrodes 20.

Figure 5C:
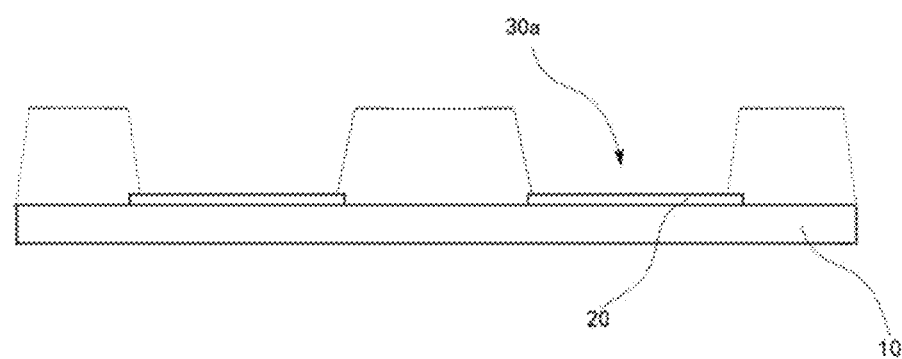

As shown in FIG. 5c, the pixel-defining material 30' is etched to form a plurality of first openings 30a exposing at least a portion (e.g., at least a central portion) of the plurality of first electrodes 20.

Figure 5D:
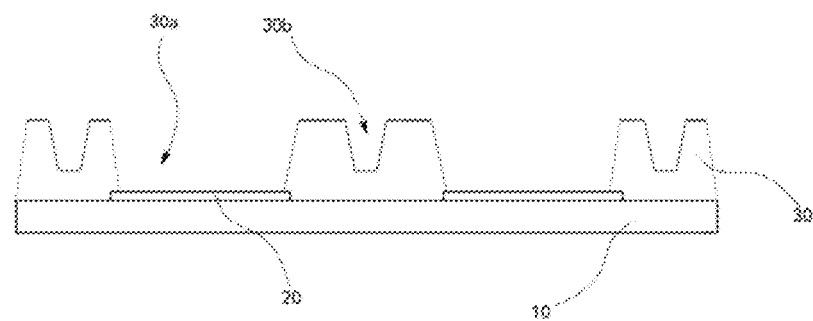

As shown in FIG. 5d, the pixel-defining material 30' is etched to form a plurality of grooves 30b.

That is, in the embodiment shown in FIGS. 5a to 5d, the first opening 30a and the groove 30b are formed by different etching steps.

FIGS. 6a to 6d are schematic views schematically illustrating forming a pixel-defining layer on a substrate according to still another embodiment of the present disclosure.

Figure 6A:
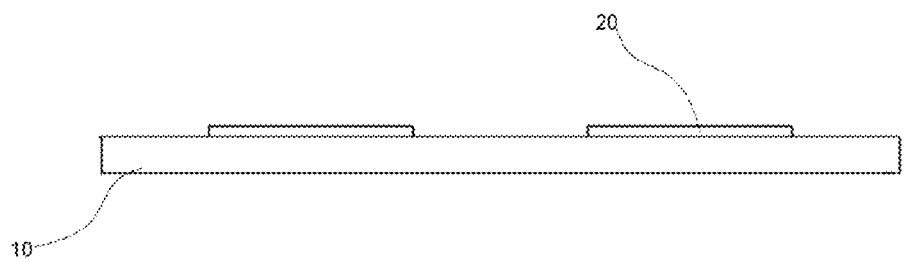
FIGS. 6a-6d are schematic views schematically illustrating forming a pixel-defining layer on a substrate according to still another embodiment of the present disclosure.
Figure 6B:
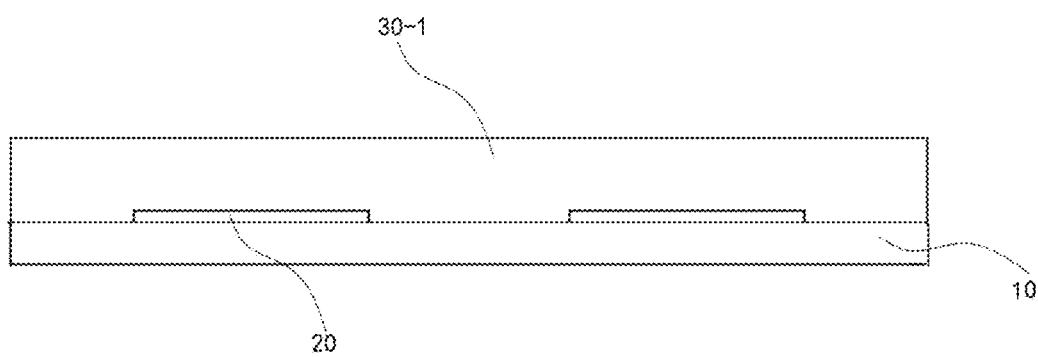

As shown in FIGS. 6a and 6b, a first pixel-defining material 30-1 is deposited on the substrate 10 to cover the substrate 10 and the plurality of first electrodes 20.

Figure 6C:
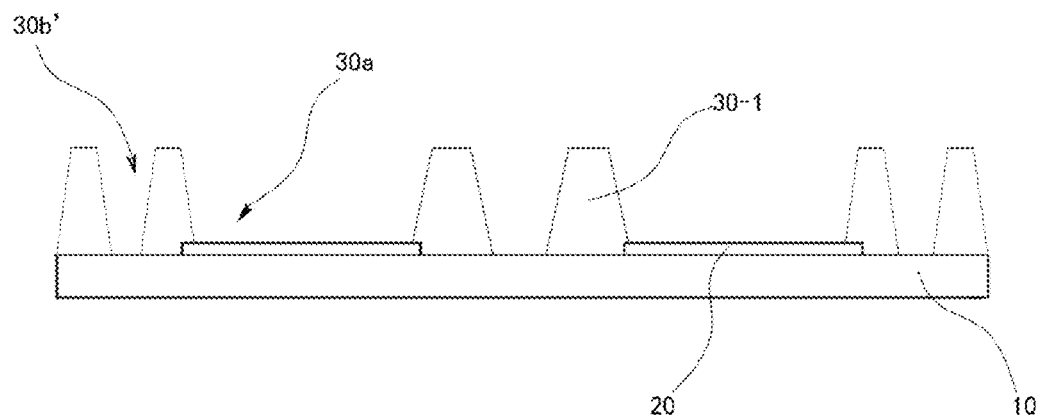

As shown in FIG. 6c, the first pixel-defining material 30-1 is etched to form a plurality of first openings 30a exposing at least a portion (for example, at least a central portion) of the plurality of first electrodes 20 and a plurality of previous grooves 30b' which are between the adjacent first openings 30a and expose the substrate 10.

Figure 6D:
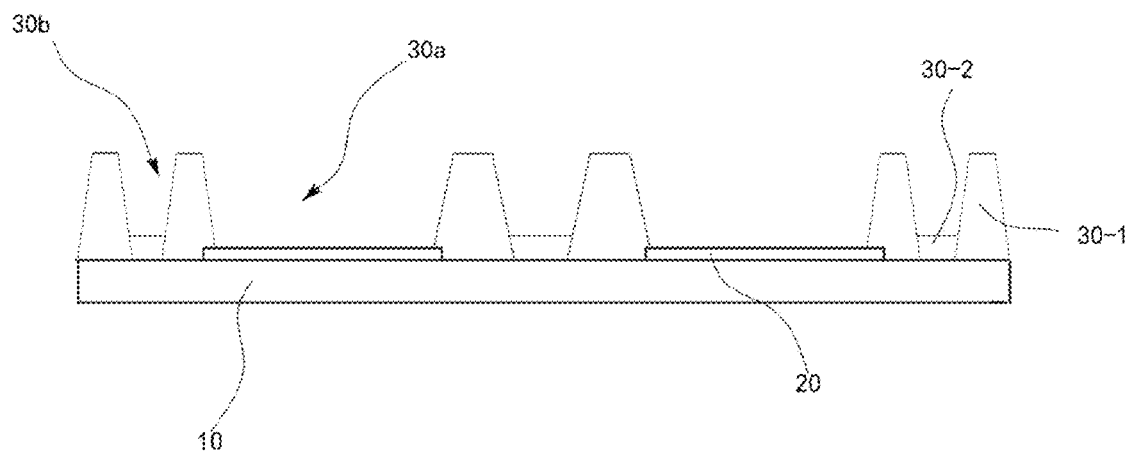

As shown in FIG. 6d, a second pixel-defining material 30-2 is deposited in the plurality of previous grooves 30b' to form a plurality of grooves 30b.

According to an exemplary embodiment of the present disclosure, the first pixel-defining material 30-1 and the second pixel-defining material 30-2 may be different, but the present disclosure is not limited thereto, and the first pixel-defining material 30-1 and the second pixel-defining material 30-2 can be the same.

The foregoing description of specific exemplary embodiments of the present disclosure has been given with reference to the drawings. These exemplary embodiments are not intended to be exhaustive or to limit the present disclosure to the precise forms disclosed, and it is apparent that those skilled in the art can make many modifications and changes in light of the above teachings. Therefore, the scope of the present disclosure is not intended to be limited to the foregoing embodiments, but is intended to be defined by the claims and their equivalents.

What is claimed is:

1. A display panel, comprising:
    a substrate provided with a first organic light emitting element and a second organic light emitting element which are adjacent to each other and configured to emit light of different colors; and
    a pixel-defining layer disposed on the substrate, the pixel-defining layer having a first opening and a second opening for exposing the first organic light emitting element and the second organic light emitting element, respectively, and having a groove disposed on a side of the pixel-defining layer away from the substrate, wherein:
    the groove is disposed in the pixel-defining layer between the first opening and the second opening, and has a depth less than a thickness of the pixel defining layer;
    the pixel-defining layer comprises a first sub-layer and a second sub-layer, the first sub-layer has a first via hole passing through the first sub-layer, and the second sub-layer is disposed on at least in the first via hole to form the groove; and
    a material of the first sub-layer is different from a material of the second sub-layer, and the material of the second sub-layer is different from a material of the first organic light emitting element and a material of the second organic light emitting element.

2. The display panel according to claim 1, wherein the first organic light emitting element emits red light and the second organic light emitting element emits green light.

3. The display panel according to claim 1, wherein the depth of the groove is larger than a thickness of the first organic light emitting element and the second organic light emitting element.

4. The display panel according to claim 1, wherein an angle formed by a sidewall of the groove and a bottom surface of the groove is not less than 142 degrees.

5. The display panel according to claim 1, wherein the second sub-layer covers at least a part of a surface of the first sub-layer away from the substrate.

6. A method of manufacturing a display panel, comprising:
    forming a pixel-defining layer on a substrate;
    forming a first opening and a second opening adjacent to each other and a groove between the first opening and the second opening in the pixel-defining layer; and
    forming a first organic emitting element and a second organic emitting element in the first opening and the second opening, respectively, wherein the first organic emitting element and the second organic emitting element emit light of different colors,
    wherein the groove has a depth less than a thickness of the pixel-defining layer,
    wherein forming the first opening and the second opening adjacent to each other and the groove between the first opening and the second opening in the pixel-defining layer comprises:
    patterning a pixel-defining material to form the first opening and the second opening and a via hole between the first opening and the second opening, the via hole passing through the pixel-defining material; and
    depositing and patterning another pixel-defining material at least in the via hole to form the groove at a position corresponding to the via hole,
    wherein the pixel-defining material is different from said another pixel-defining material, and said another pixel-defining material is different from a material of the first organic light emitting element and a material of the second organic light emitting element.

7. The method of manufacturing a display panel according to claim 6, wherein depositing and patterning said another pixel-defining material at least in the via hole to form the groove at the position corresponding to the via hole comprises:
    depositing and patterning said another pixel-defining material on the pixel-defining material and in the via hole to form the groove at the position corresponding to the via hole.

8. The method of manufacturing a display panel according to claim 6, wherein depositing and patterning said another pixel-defining material at least in the via hole to form the groove at the position corresponding to the via hole comprises:
    depositing said another pixel-defining material in the via hole to form the groove.

* * * * *